(12) United States Patent
Murrell et al.

(10) Patent No.: US 10,056,320 B2
(45) Date of Patent: Aug. 21, 2018

(54) CERAMIC CAPACITORS WITH IMPROVED LEAD DESIGNS

(71) Applicant: Kemet Electronics Corporation, Simpsonville, SC (US)

(72) Inventors: Jeffrey S. Murrell, Simpsonville, SC (US); Lonnie G. Jones, Simpsonville, SC (US); Jeffrey W. Bell, Simpsonville, SC (US)

(73) Assignee: KEMET Electronics Corporation, Simpsonville, SC (US)

( * ) Notice: Subject to any disclaimer, the term of this patent is extended or adjusted under 35 U.S.C. 154(b) by 131 days.

(21) Appl. No.: 14/525,603

(22) Filed: Oct. 28, 2014

(65) Prior Publication Data

US 2015/0114697 A1    Apr. 30, 2015

Related U.S. Application Data

(60) Provisional application No. 61/896,818, filed on Oct. 29, 2013.

(51) Int. Cl.
*H01G 4/232* (2006.01)
*H01G 4/30* (2006.01)
(Continued)

(52) U.S. Cl.
CPC ....... *H01L 23/49589* (2013.01); *H01G 4/232* (2013.01); *H01G 4/248* (2013.01);
(Continued)

(58) Field of Classification Search
CPC ......... H01L 23/49589; H01L 23/49565; H01L 23/29861; H01L 23/49582;
(Continued)

(56) References Cited

U.S. PATENT DOCUMENTS

| 4,158,218 A * | 6/1979 | McLaurin | H01G 2/065 |
| | | | 361/306.1 |
| 4,320,281 A * | 3/1982 | Cruickshank | B23K 1/0056 |
| | | | 219/121.14 |

(Continued)

FOREIGN PATENT DOCUMENTS

| JP | 04-188810 | 7/1992 |
| JP | 10004168 A * | 1/1998 |

(Continued)

OTHER PUBLICATIONS

Office Action (Decision of Refusal), JPO, dated Feb. 27, 2018, JP Application 2016-526816, 3 pages with machine translation (6 pages total).*

(Continued)

*Primary Examiner* — Nathan Milakovich
(74) *Attorney, Agent, or Firm* — Joseph T. Guy; Patent Filing Specialist, Inc.

(57) ABSTRACT

An electronic component is provided with improved thermal stability. The electronic component comprises at least one capacitive element wherein the capacitive element comprises internal electrodes of alternating polarity separated by a dielectric. External terminations with a first external termination of the external terminations are in electrical contact with internal electrodes of a first polarity and a second external termination of the external terminations are in electrical contact with internal electrodes of a second polarity. A first external lead frame is in electrical contact with the first external termination with a conductive bond there between wherein the first external lead frame comprises at least one feature selected from the group consisting of a perforation, a protrusion and an edge indentation.

47 Claims, 10 Drawing Sheets

Figure 1:
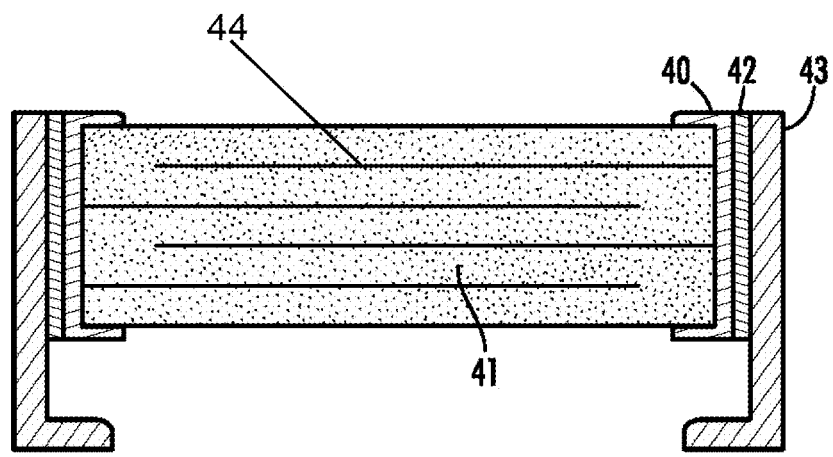

(51) Int. Cl.
  *H01L 23/495* (2006.01)
  *H01G 4/248* (2006.01)
  *H01L 23/498* (2006.01)
  *H01G 4/12* (2006.01)
(52) U.S. Cl.
  CPC .......... *H01G 4/30* (2013.01); *H01L 23/49565* (2013.01); *H01L 23/49582* (2013.01); *H01L 23/49861* (2013.01); *H01G 4/12* (2013.01); *H01L 2924/0002* (2013.01)
(58) Field of Classification Search
  CPC ...... H01L 2924/0002; H01L 23/49861; H01G 4/232; H01G 4/248; H01G 4/30; H01G 4/12
  See application file for complete search history.

(56) References Cited

U.S. PATENT DOCUMENTS

| | | | | |
|---|---|---|---|---|
| 4,609,586 | A * | 9/1986 | Jensen | H05K 1/056 |
| | | | | 428/209 |
| 4,617,609 | A * | 10/1986 | Utner | H01G 2/06 |
| | | | | 29/25.42 |
| 4,630,170 | A † | 12/1986 | Kask | |
| 4,788,625 | A * | 11/1988 | Maijers | H01G 4/228 |
| | | | | 29/25.42 |
| 6,046,902 | A * | 4/2000 | Nakagawa | H01G 4/228 |
| | | | | 361/306.1 |
| 6,081,416 | A | 6/2000 | Trinh et al. | |
| 6,181,544 | B1 | 1/2001 | Nakagawa et al. | |
| 6,191,933 | B1 | 2/2001 | Ishigaki et al. | |
| 6,288,887 | B1 * | 9/2001 | Yoshida | H05K 3/3426 |
| | | | | 361/306.1 |
| 6,310,759 | B2 | 10/2001 | Ishigaki et al. | |
| 6,473,291 | B1 † | 10/2002 | Stevenson | |
| 6,515,844 | B1 | 2/2003 | Moriwaki et al. | |
| 6,523,235 | B1 | 2/2003 | Ishigaki et al. | |
| 6,574,089 | B1 * | 6/2003 | Moriwaki | H01G 4/228 |
| | | | | 361/306.3 |
| 6,958,899 | B2 * | 10/2005 | Togashi | H01G 2/065 |
| | | | | 361/303 |
| 6,972,943 | B2 * | 12/2005 | Kato | H01G 9/012 |
| | | | | 257/E23.043 |
| 7,436,649 | B2 * | 10/2008 | Omura | H01G 2/06 |
| | | | | 29/25.42 |
| 9,042,079 | B2 * | 5/2015 | Masuda | H01G 4/01 |
| | | | | 361/301.2 |
| 9,607,769 | B2 * | 3/2017 | Park | H01G 4/30 |
| 2001/0020740 | A1 * | 9/2001 | Moden | H01L 25/105 |
| | | | | 257/685 |
| 2009/0147440 | A1 † | 6/2009 | Cygan et al. | |
| 2010/0123995 | A1 * | 5/2010 | Otsuka | H01G 2/06 |
| | | | | 361/308.1 |
| 2010/0182732 | A1 * | 7/2010 | Togashi | H01G 2/065 |
| | | | | 361/303 |
| 2010/0243307 | A1 | 9/2010 | McConnell et al. | |
| 2011/0292567 | A1 | 12/2011 | McConnell et al. | |
| 2012/0133034 | A1 * | 5/2012 | Imura | H01L 21/4842 |
| | | | | 257/666 |
| 2012/0326569 | A1 * | 12/2012 | Itagaki | H01G 4/30 |
| | | | | 310/365 |
| 2013/0016488 | A1 * | 1/2013 | McConnell | H01G 4/38 |
| | | | | 361/774 |
| 2013/0343027 | A1 * | 12/2013 | Perea | H01C 1/14 |
| | | | | 361/813 |
| 2014/0345927 | A1 * | 11/2014 | Itagaki | H01G 2/065 |
| | | | | 174/260 |
| 2015/0014038 | A1 * | 1/2015 | Park | H01G 2/065 |
| | | | | 174/260 |
| 2015/0187495 | A1 * | 7/2015 | Maeda | H01G 4/30 |
| | | | | 361/303 |
| 2018/0033556 | A1 * | 2/2018 | Itamochi | H01G 4/30 |

FOREIGN PATENT DOCUMENTS

| | | | |
|---|---|---|---|
| JP | 2000-235931 A | | 8/2000 |
| JP | 2002-57064 A | | 2/2002 |
| JP | 2008-130954 A | | 6/2008 |
| JP | 2012-023322 | | 2/2012 |
| JP | 2013-111002 | * | 5/2013 ............. H01G 2/065 |
| JP | WO 2016080350 A1 | * | 5/2016 ............. H01G 4/30 |

OTHER PUBLICATIONS

ISA/KR; International Search Report and Written Opinion; dated: Jan. 23, 2015: prepared for PCT/US2014/062573: Applicant: Kemet Electronics Corporation.

* cited by examiner
† cited by third party

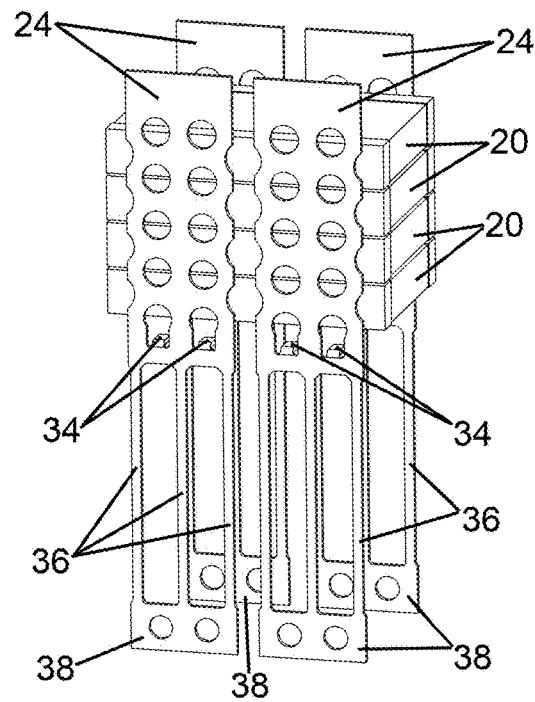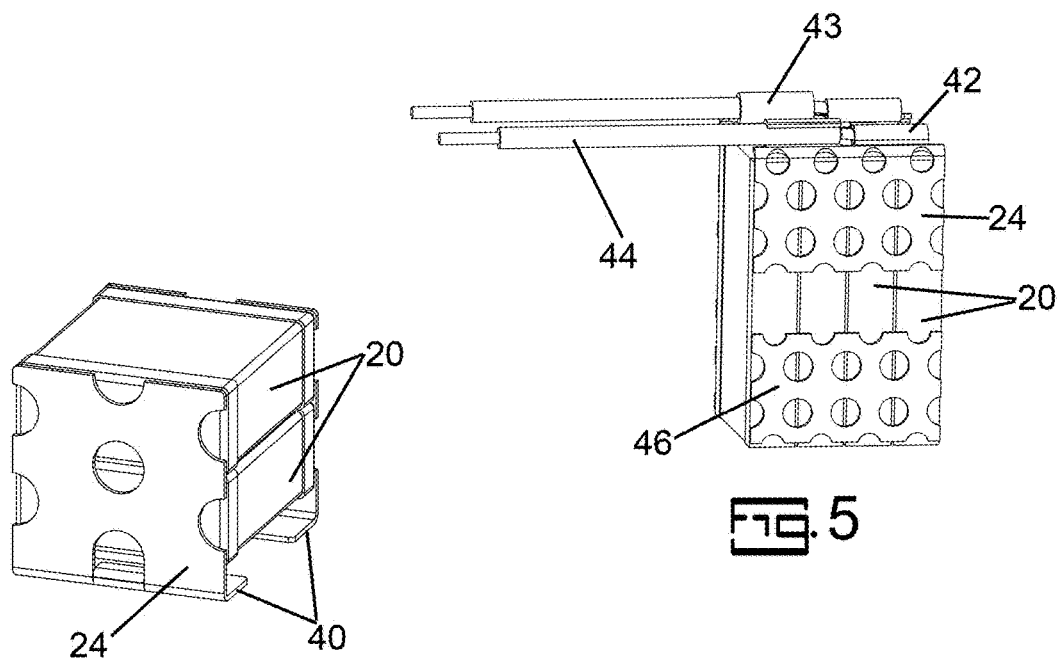

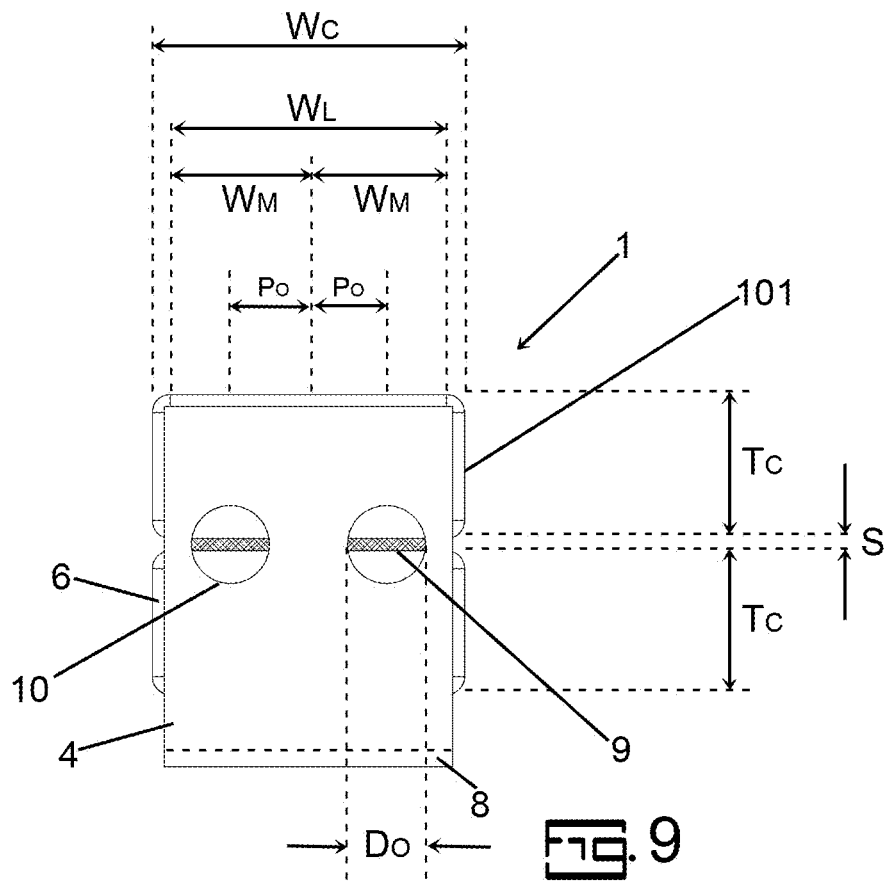
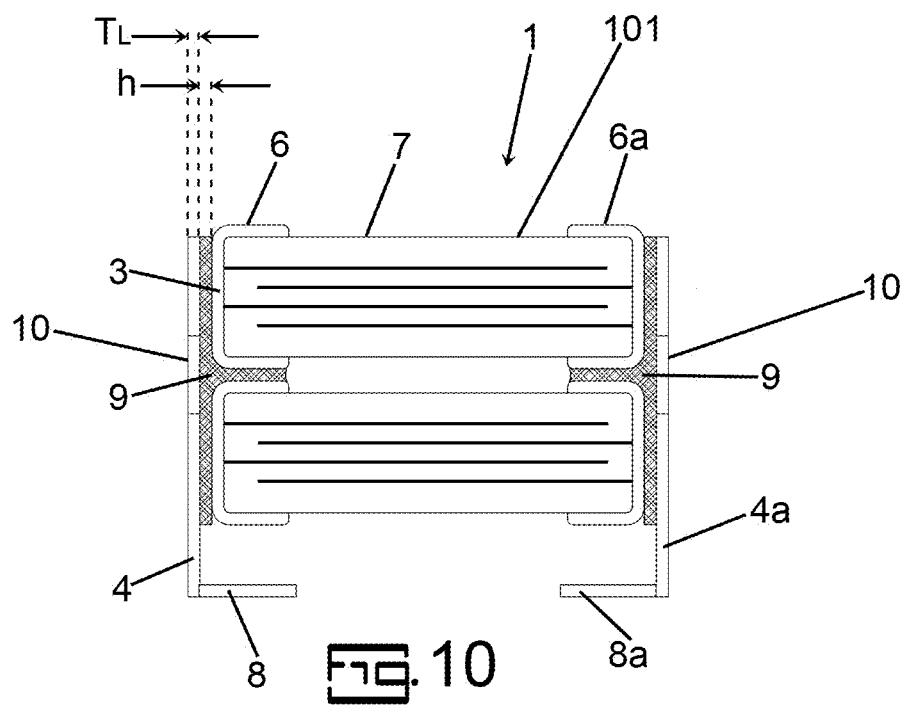

CERAMIC CAPACITORS WITH IMPROVED LEAD DESIGNS

CROSS-REFERENCE TO RELATED APPLICATIONS

This application claims priority to U.S. Provisional Patent Appl. No. 61/896,818 filed Oct. 29, 2013 which is incorporated herein by reference.

BACKGROUND

The present invention is related to improvements in lead frames and lead frame bonding wherein the improvements mitigate fatigue cracking in the bond related to thermal cycling. Furthermore in the case of ceramic components such as multilayer ceramic capacitors (MLCC) the present invention mitigates the formation of stress cracks in the ceramic capacitor in addition to the bonding material.

In recent years, chip-type multilayer ceramic capacitors have come into general use for mounting directly to a substrate. However, if the substrate is deformed by deflection, a mechanical stress is transferred to the multilayer ceramic capacitor which may cause a crack to form in the ceramic capacitor. This potential for a crack increases as the size of the capacitor increases due to the increase in the bending moment on the larger capacitor. The deflection is of special concern for capacitors having a principal dimension greater than about 2.54 mm (0.1 inches).

Lead frames have been employed for many years as a connection to one or more capacitors. The lead frames are attached to the external termination of the capacitor and bonded to the substrate by through hole or surface mounting technology to a circuit. A key consideration for the lead frame designs is the ability of the leads to absorb mechanical stresses thereby somewhat isolating the ceramic capacitor, after mounting to a circuit board, from the deflections that occur during temperature cycling. The mechanical stresses are due to differences in the coefficient of thermal expansion (CTE) between the ceramic capacitor and the circuit board. If the lead frame is not effective in absorbing this mismatch cracks form in the ceramic capacitors ultimately leading to electrical failure.

In addition, when ceramic capacitors bonded to metal lead frames are bonded to metal clad substrates possessing high coefficients of expansion, such as aluminum for example, large mechanical stresses can be applied to the ceramic component due to the large difference in the coefficient of thermal expansion of the ceramic component and the substrate thereby causing a stress crack on the ceramic component to occur after only a few temperature cycles.

U.S. Pat. No. 6,081,416 describes the use of nickel iron lead frames with a CTE which is 25% to 50% lower than the CTE of the ceramic of the capacitor. These devices are only suitable for preventing cracking of the ceramic on temperature cycling or thermal shock at temperatures of up to about 150° C.

U.S. Pat. No. 6,515,844 describes a metallic plate of oxygen free copper with slits connected perpendicular to the multilayer ceramic capacitors. The slits can be filled with a substance having a larger coefficient of linear expansion or a substance having a lower Young's modulus with respect to the material comprising the external terminal. More particularly, the filling substance contracts more dramatically than the external terminal at a low temperature, and, accordingly, the deformation (expansion, contraction) of the external terminal is restrained, that is, the expansion and contraction of the external terminal itself are restrained owing to the influence from the expansion and the contraction of the filled substance, and consequently the stress to be applied onto the electronic part is reduced. Moreover, when a substance having a lower Young's modulus, with respect to the external terminal, is provided for filling the slit the stress on the electronic part itself becomes smaller. When exposed to 100 temperature cycles of −55 to +125° C. the presence of multiple slits filled with epoxy, resin or solder were shown to prevent crack formation. This technology is not suitable for use above about 125° C. and certainly not above 150° C.

U.S. Pat. No. 6,310,759 describes a folded lead frame for crack prevention in capacitor stacks wherein one or more holes are provided in the outer portion of the lead to allow the components to be held during assembly. In U.S. Pat. No. 6,181,544 a protrusion from the metal plate to the termination of a multilayer ceramic capacitor is provided for uniformity of bonding material and thermal shock prevention for crack sensitive Pb-based ceramics.

Ceramic capacitors having metal plate terminals that absorb thermal stress are described in U.S. Pat. No. 6,191,933 wherein folded metal plate terminals with at least one hole is provided in the terminal portion. A method of manufacturing these types of capacitor is described in U.S. Pat. No. 6,523,235 using solder paste processing.

The current state of the art is capable of providing lead frame and material designs to lower stresses up to a maximum temperature of about 150° C. However, to facilitate the use of ceramic capacitors at even higher temperatures it has been necessary to use a soft lead attachment to make electrical connection to lead frames connecting two or more ceramic capacitors. This design avoids the mechanical stress caused by constraining the movement of the capacitor on heating in surface mounting or through-hole connections to the electrical circuit. Even with this provision, at temperatures above about 150° C. the lead frame must be bonded to the ceramic capacitors using a bonding material designed to avoid excessive stress due to the propensity for cracking of the bond between the lead frame and the capacitor.

In spite of the ongoing efforts there is still no suitable solution for larger capacitors, especially for use in high temperature environments such as above 150° C. A capacitor suitable for such uses is provided herein.

SUMMARY OF THE INVENTION

It is an object of the invention to provide a capacitor element that is arranged with an external lead frame that increases the mechanical robustness of the capacitor element when mounted to substrates with high coefficient of expansion, above 13 ppm/° C., and increases the mechanical robustness in applications where the operating temperature exceeds 125° C. and more preferably 150° C.

It is an object of the invention to provide an external metal lead for attachment to the external terminals of one or more ceramic capacitors where the lead reduces the stresses on the ceramic element which occur during temperature cycling.

It is another object of the invention to provide an external metal lead comprising a non-ferrous low inductance lead material having a coefficient of thermal expansion between about 13 and about 30 ppm/° C. for attachment to the external terminals of one or more ceramic capacitors that can be used to mount ceramic capacitors to metal-clad substrates possessing a high coefficient of thermal expansion, such as ranging from 13 to 30 ppm/° C., without incurring failures during temperature cycling.

It is another object of the invention to provide an external metal lead for attachment to the external terminals of one or more ceramic capacitors which possess stress-relieving openings in the external lead frame that are located principally in the areas between the ceramic capacitor elements to reduce stress on the ceramic capacitor elements and on the material bonding the capacitor elements to the external metal lead.

It is another object of the invention to provide an external metal lead for attachment to the external terminals of one or more ceramic capacitors where the metal lead possesses openings in the external lead frame in the areas of the ceramic element terminal members whose locations and dimensions are determined based on the coefficient of thermal expansion of the external lead frame, the ceramic element, and the bonding material, the stress/strain properties of the bonding material, and the thickness of the bonding material.

These and other advantages, as will be realized, are provided in an electronic component. The electronic component comprises at least one capacitive element wherein the capacitive element comprises internal electrodes of alternating polarity separated by a dielectric. External terminations with a first external termination of the external terminations are in electrical contact with internal electrodes of a first polarity and a second external termination of the external terminations are in electrical contact with internal electrodes of a second polarity. A first external lead frame is in electrical contact with the first external termination with a conductive bond there between wherein the first external lead frame comprises at least one feature selected from the group consisting of a perforation, a protrusion and an edge indentation.

Yet another embodiment is provided in an electronic device. The electronic device comprises a component comprising a substrate and at least one capacitive element mounted on the substrate wherein the capacitive element comprises internal electrodes of alternating polarity separated by a dielectric. External terminations with a first external termination of the external terminations are in electrical contact with internal electrodes of a first polarity and a second external termination of the external terminations are in electrical contact with internal electrodes of a second polarity. A first external lead frame is in electrical contact with the first external termination with a conductive bond there between wherein the first external lead frame comprises at least one feature selected from the group consisting of a perforation, a protrusion and an edge indentation.

FIGURES

Figure 2:
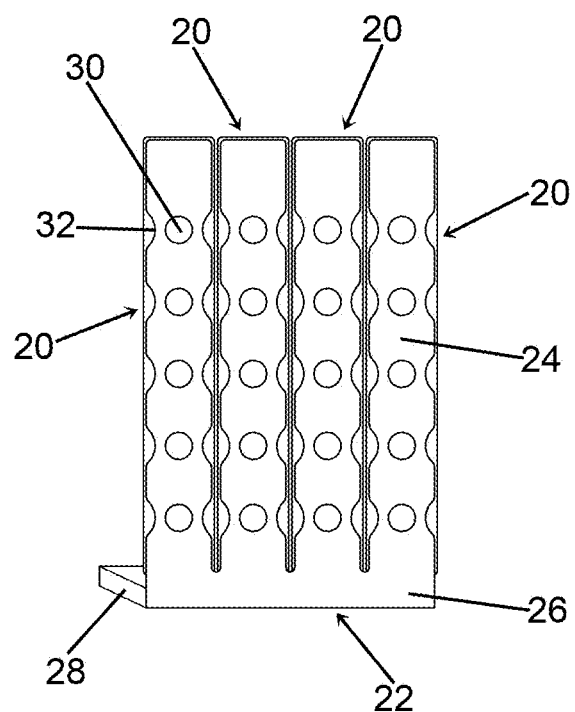
Figure 6:
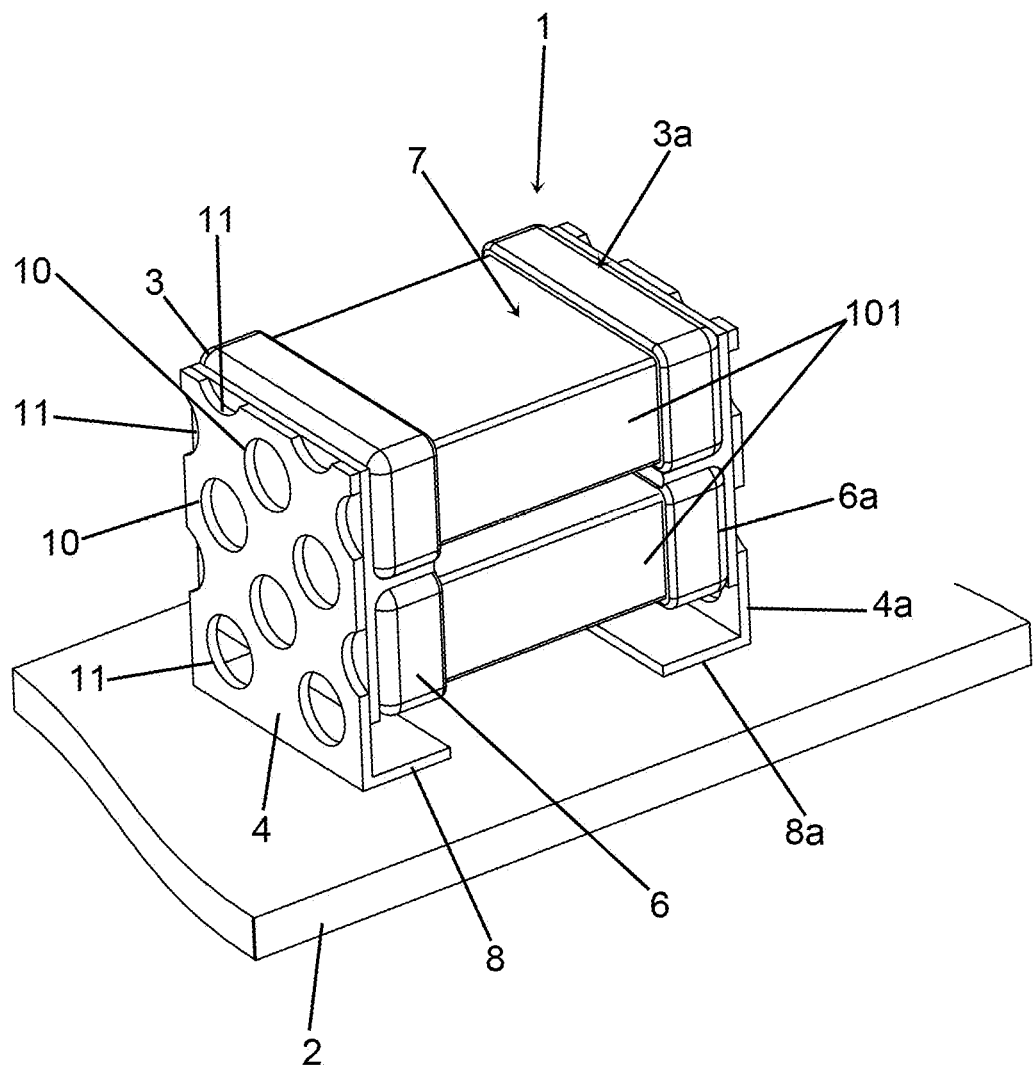
Figure 7:
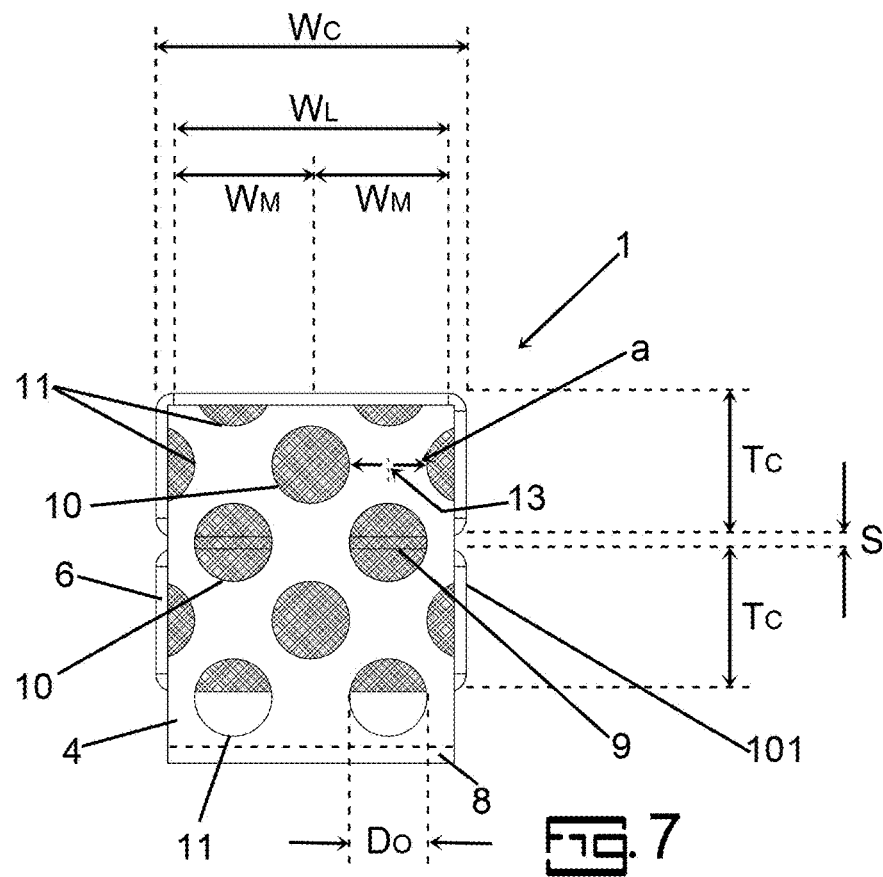
Figure 8:
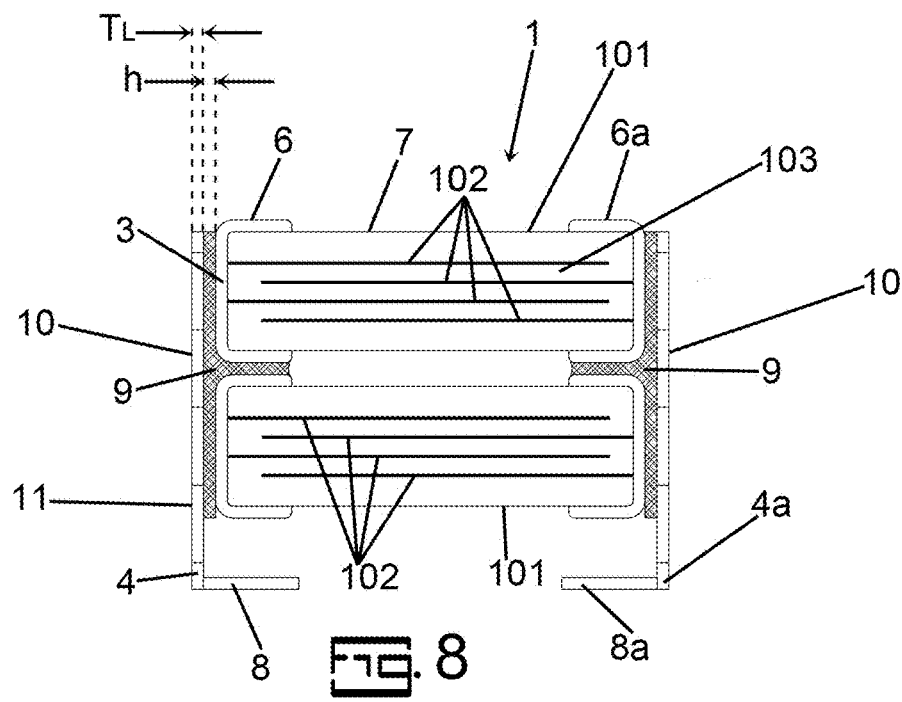
Figure 11:
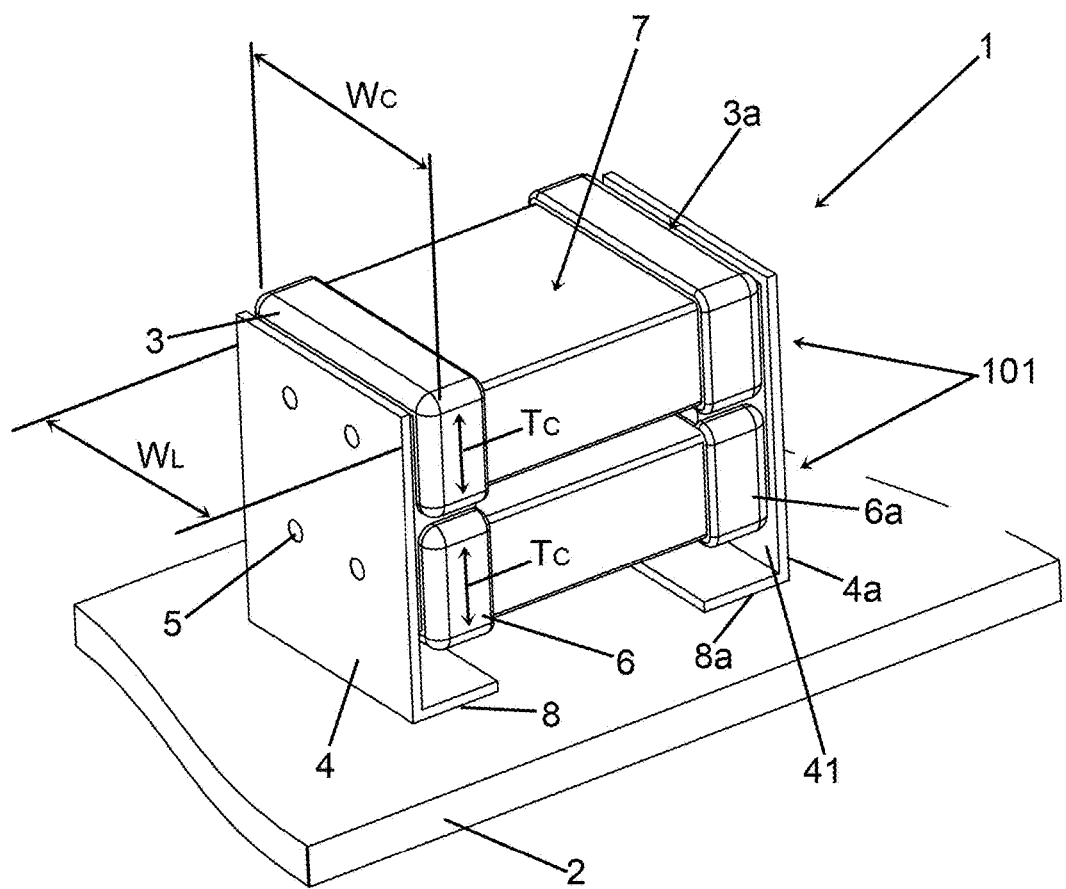
Figure 12:
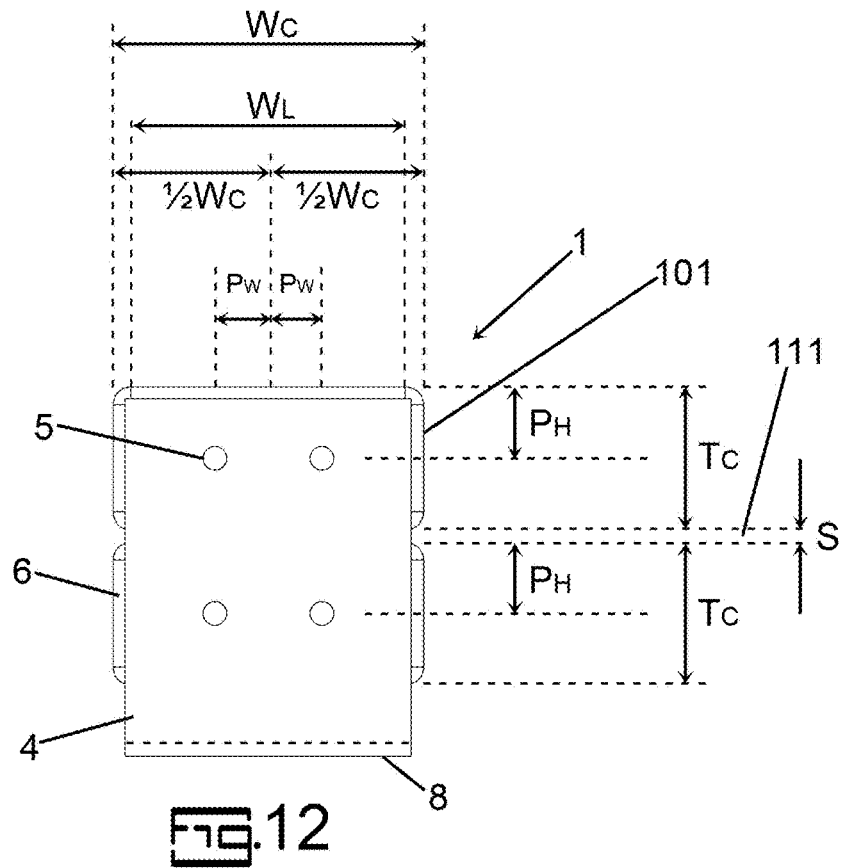
Figure 13:
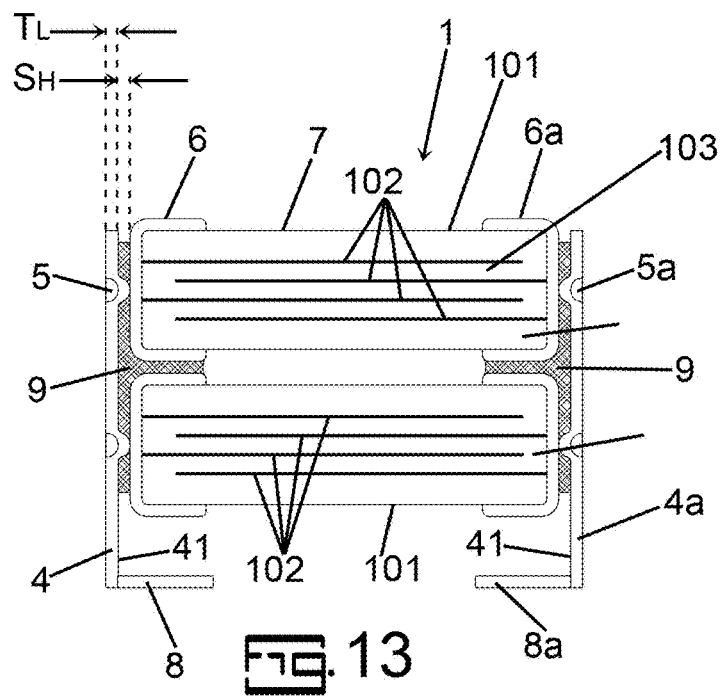
Figure 14:
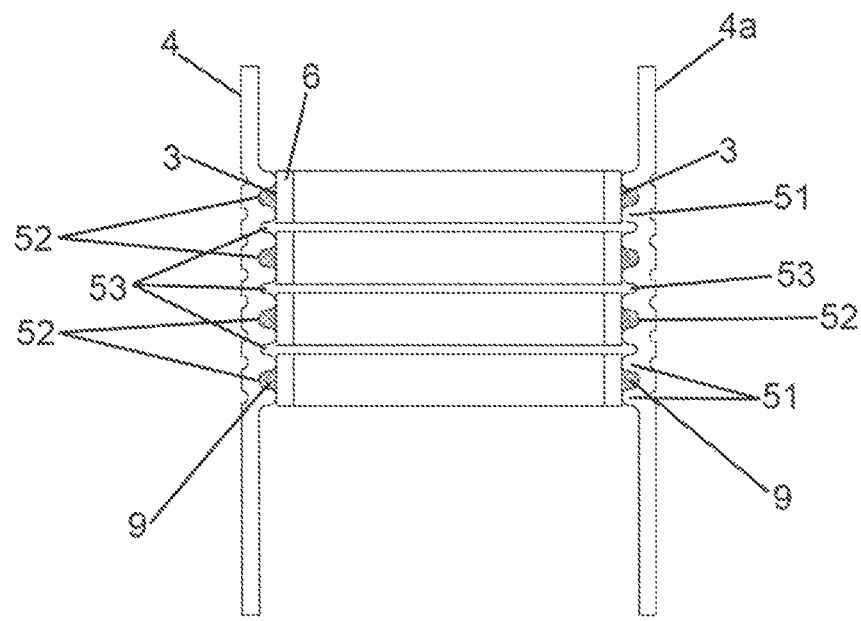
Figure 15:
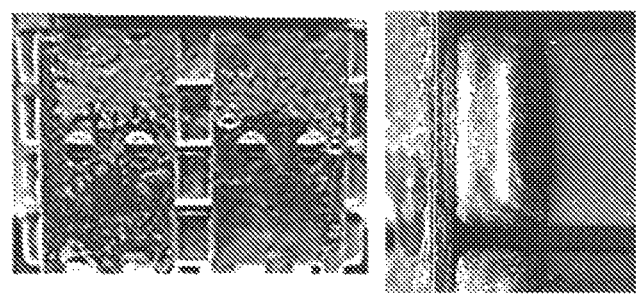
Figure 16:
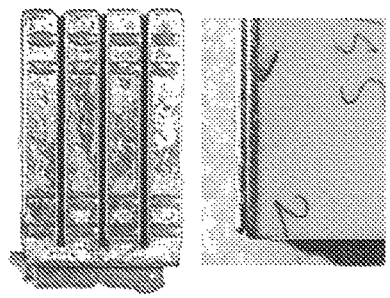
Figure 17:
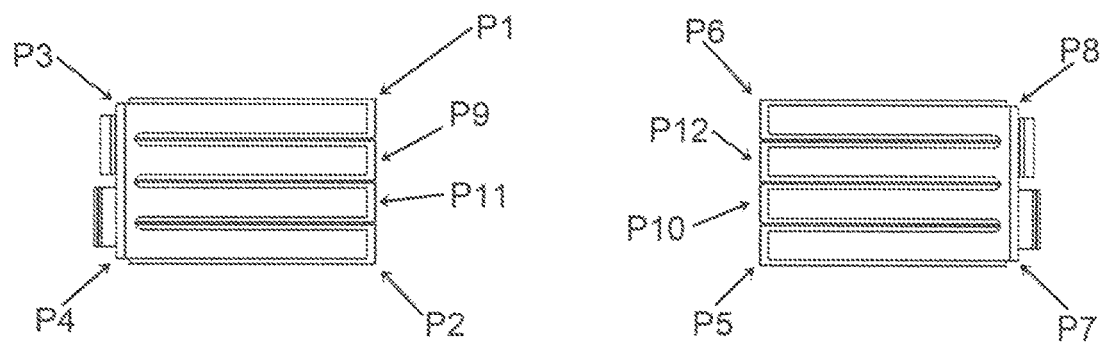
Figure 18:
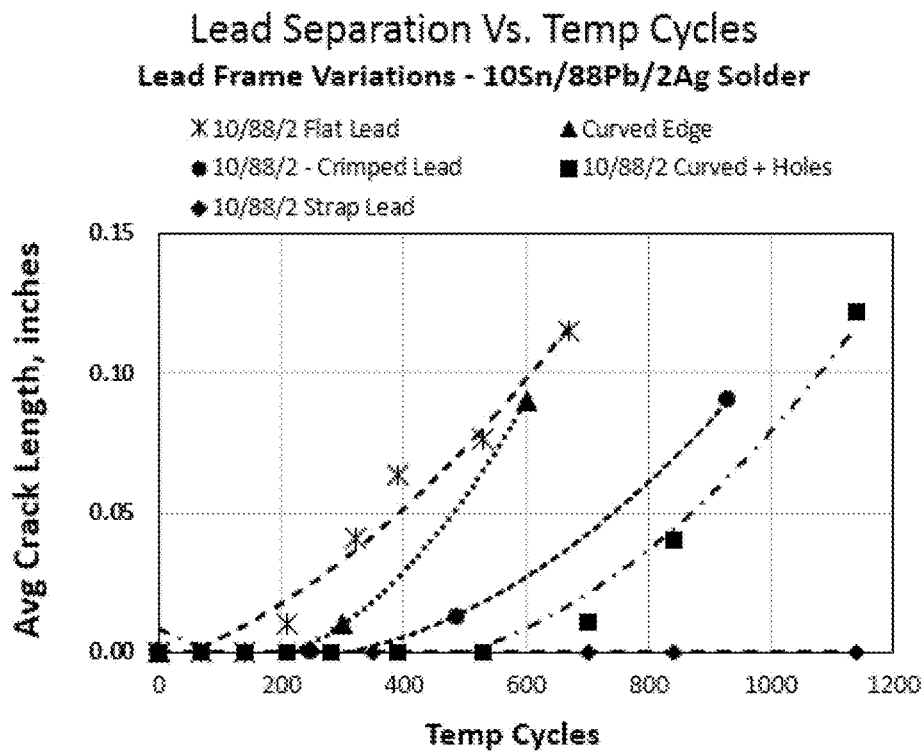
Figure 19:
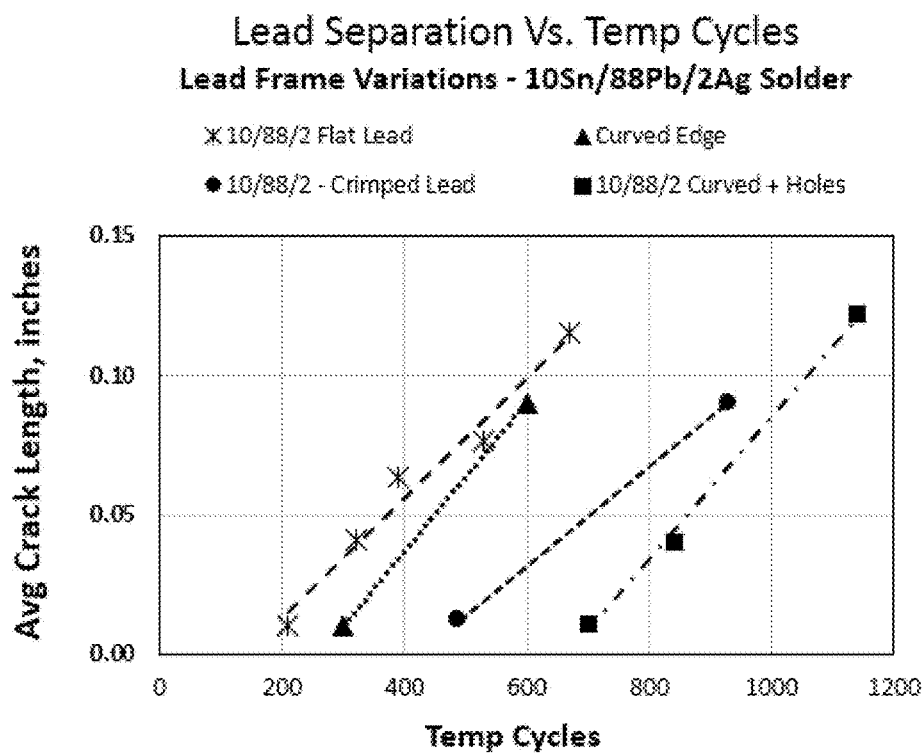

FIG. 1 is a schematic cross-sectional side view of an embodiment of the invention.
FIG. 2 is a schematic end view of an embodiment of the invention.
FIG. 3 is a schematic perspective end view of an embodiment of the invention.
FIG. 4 is a schematic perspective end view of an embodiment of the invention.
FIG. 5 is a schematic perspective end view of an embodiment of the invention.
FIG. 6 is a schematic perspective view of an embodiment of the invention.
FIG. 7 is a schematic end view of an embodiment of the invention.
FIG. 8 is a schematic cross-sectional side view of an embodiment of the invention.
FIG. 9 is a schematic end view of an embodiment of the invention.
FIG. 10 is a schematic cross-sectional side view of an embodiment of the invention.
FIG. 11 is a schematic perspective view of an embodiment of the invention.
FIG. 12 is a schematic end view of an embodiment of the invention.
FIG. 13 is a schematic cross-sectional side view of an embodiment of the invention.
FIG. 14 is a schematic cross-sectional side view of an embodiment of the invention.
FIG. 15 is an end view of an embodiment of the invention.
FIG. 16 is an end view of an embodiment of the invention.
FIG. 17 is a schematic representation of a test protocol.
FIG. 18 is a graphical representation of an advantage provided by the invention.
FIG. 19 is a graphical representation of an advantage provided by the invention.

DESCRIPTION

The instant invention is specific to electronic component with improved lead frames capable of mitigating fatigue cracking of the bonding material forming the joint related to thermal cycling. In the specific case of ceramic components, such as multilayer ceramic capacitors (MLCC's), the present invention also mitigates stress cracks in the ceramic capacitor in addition to the bonding material between the ceramic capacitor and lead frame.

Monolithic ceramic capacitor assemblies, either with a single ceramic capacitor or with a stack of ceramic capacitors, are provided with improved lead frames wherein the lead frames are electrically connected to the external terminations of the capacitors. The lead frames, and connection between the lead frame and external termination of the capacitor, reduces the impact of those stresses which occur during repeated thermal expansion and contraction and particularly those stresses applied to the ceramic capacitor and the material connecting the capacitor to the lead frame. More specifically the present invention allows for a monolithic ceramic capacitor which has improved reliability when mounted to substrates with a high coefficient of expansion, such as above about 13 ppm/° C., and when operated at high temperatures, such as above 125° C. and more preferably above 150° C. The present invention is beneficial for capacitors of all sizes, however, the results are most appreciated with large monolithic ceramic capacitors defined herein as those having at least one principle dimension of at least 2.54 mm (0.1 inches).

The improved lead frames exert less stress in the connection between the lead frame and the external termination of the capacitor thereby reducing the tendency for joint cracking that may eventually result in lead detachment. The resulting designs are particularly applicable to large ceramic capacitors and those capacitors that are required in high temperature automotive, down-hole, avionics and geothermal applications. More specifically, the present invention provides a capacitor suitable for uses at temperatures in excess of 150° C.

The problem of cracking in the connection between the lead frame and capacitor is mitigated by the use of a lead frame with at least one feature selected from at least one perforation, at least one protrusion or at least one edge indentation. Lead frames with one or more perforations therein have a reduced mass. The lead frame with a curved connection, or a protrusion, between components in the center of the lead also lowers stress. Furthermore, the leads can be attached across multiple components such that the length of the total attachment area to the lead frame is minimized thereby further reducing the effect of CTE mismatch thereby further lowering stress. The improved lead frame allows the amount of bonding material between the lead frame and capacitor to be optimized since the lead frame may be crimped or formed around the contact areas to increase the distance between the lead frame and external termination surface of the capacitor thereby allowing more bonding material within the desired areas of contact.

The present invention allows for reduced stresses at a higher temperature range, preferably above 150° C., that typically result in stress fractures within the bonding material. The stresses are known to cause fatigue in the bond, which in the case of solder, is referred to in the art as solder fatigue. The improved lead frames, as described further herein, minimize bond fatigue, or solder fatigue, that typically occurs during thermal cycling.

The principle materials used to manufacture electronic components, such as ceramic capacitors bonded to external metal lead frames, usually possess varying coefficients of thermal expansion. When the difference in the coefficient of thermal expansion of the metal lead frame and the ceramic component is large, and especially when the capacitor is at least 2.54 mm (0.10 inches) in length in at least one dimension, high shear strain occurs in the bonding material used to bond the lead frame to the ceramic component when the component is subjected to high temperatures. High shear strain will eventually lead to failure of the bonding material especially when applied in a cyclic fashion as is common with components which may experience temperature cycling. The time to failure for the bonding material depends on the differences in the coefficient of thermal expansion of the lead frame and the ceramic component, the shear modulus of the bonding material, variations in the shear modulus of the bonding material with temperature, changes in the shear modulus of the bonding material over time, the maximum length of the lead frame between openings and the thickness of the bonding material. The complexity of the system has defined empirical approaches to a solution and has instead, required significant research to ascertain the critical combination of parameters.

As described by Lechovic and others at Institute of Production Technologies, Slovak University of Technology, Slovak Republic, *Solder Joint Reliability*, 2009, the shear strain on a bonding material that joins two components, such as a ceramic capacitor and a lead frame, can be described by the relationship:

$$\Delta\gamma = \Delta\alpha \cdot \Delta T \cdot (a/h)$$

wherein $\Delta\gamma$ is the shear strain imposed on the bonding material,
$\Delta\alpha$ is the difference in coefficient of expansion between the joined materials,
$\Delta T$ is the temperature change,
a is the distance from the neutral expansion point of the joined materials, and
h is the thickness of the bonding material.

It is known that while experiencing shear strain the bonding joint will exhibit creep deformation to relieve the stresses imposed. The creep causes small amounts of damage to the structure of the bonding material and the damage accumulates over time and with repeated temperature cycles. The damage reduces the strength of the bonding joint and as the damage accumulates the bonding joint will eventually fail. Minimizing the strain imposed on the bonding material increases the life expectancy of the bonding joint.

Reliable bonding joints are designed such that the shear strain imposed on the joint due to the thermal expansion mismatch between the lead frame and ceramic component does not exceed a critical design factor, referred to as $\beta$, which is the maximum allowable shear strain on the joint expressed as a fraction of the shear strain measured when the bonding material is strained to its yield point. The maximum allowable shear strain is determined by interpretation of results from accelerated thermal cycle testing, mechanical vibration testing, mechanical shock testing and cyclic stress-strain testing that preferably have been correlated to actual component bonding joint performance in operation. Values for critical design factor, $\beta$, vary depending on the type of bonding material used and the desired life expectancy of the component in operation.

The invention will be described with reference to the various figures forming an integral non-limiting component of the disclosure. Throughout the disclosure similar elements will be numbered accordingly.

An embodiment of the invention is illustrated in schematic cross-sectional side view in FIG. 1. In FIG. 1, the ceramic capacitor is preferably a multilayered ceramic capacitor comprising internal electrodes, 44, of alternating polarity separated by a dielectric, 41, wherein alternate internal electrodes terminate at opposing external terminations, 40. For the purposes of illustration the internal electrodes are illustrated in an orientation which would be parallel to the substrate with the understanding that the internal electrodes may be perpendicular to the substrate as will be more fully appreciated with further discussion herein. The capacitor may have many hundreds of internal electrodes. The external terminations may include multiple layers terminating in a solderable layer with the external termination preferably comprising plated metal layers and solder layers formed by immersion. A lead frame, 43, is attached to the external termination by a bond, 42, comprising an electrical bonding material such as a solder, transient liquid phase sintering (TLPS) adhesive, or the like. Ceramic capacitors, and particularly multilayered ceramic capacitors, are well known to those of skill in the art and are not particularly limited herein and therefore will not be further described. The lead frame and bond will be described in detail herein. A single ceramic capacitor is shown for convenience with the understanding that the number of capacitors may be very large.

An embodiment of the invention is illustrated in side view in FIG. 2. In FIG. 2 a multiplicity of capacitors, 20, is illustrated with four being illustrated for the purposes of convenience without limit thereto. The capacitors are mounted such that the internal electrodes would be perpendicular to the substrate when mounted thereto. The lead frame, 22, comprises at least one perforated plate, 24, wherein the perforated plates are integral to a plate bridge, 26, which has a mounting element, 28, in electrical contact therewith and preferably integral thereto. The mounting element is illustrated as a foot for surface mounting with the understanding that other embodiments could be used such as a pin for through hole mounting or a crimp for attachment of a wire for soft-lead mounting both of which will be more fully described herein. The perforated plate has at least one perforation, 30, defined as a void circumnavigated by material of the lead frame. The perforated plate preferably has a serrated or scalloped edge comprising at least one edge indentation, 32, defined as an inward deviation from the widest extent of the width of the perforated plate. It is preferred that each perforated plate be generally rectangular, with optional indentions in the rectangle, due to manufacturing convenience and to conform with the most common shape of the external termination of a ceramic capacitor. Protrusions, as will be more fully described herein, which would not be visible in FIG. 2 are included in a preferred option.

An embodiment of the invention is illustrated in perspective schematic side view prior to final assembly in FIG. 3. In FIG. 3, a pair of perforated plates, 24, on each side of a stack of capacitors, 20, is illustrated. Though illustrated with four capacitors the invention is not limited thereto. Optional inward extending tabs, 34, can be provided. The inward extending tabs can function as a base upon which the bottom-most capacitor rest or the bottom-most capacitor can be separated therefrom, as in FIG. 3, and the tab can function to limit the extent to which through-hole pins, 36, as a mounting element are allowed to extend into a substrate. Sacrificial supports, 38, are provided for convenience during manufacturing but removed during either the manufacturing process or just prior to the mounting process as appropriate.

An embodiment of the invention is illustrated in perspective schematic side view in FIG. 4. In FIG. 4 a pair of perforated plates, 24, each with a mounting foot, 40, as a mounting element integral thereto, sandwiches a multiplicity of ceramic capacitors, 20, there between.

An embodiment of the invention is illustrated in perspective schematic view in FIG. 5. In FIG. 5 a pair of perforated plates, 24, each with a crimp as an integral mounting element, sandwiches a multiplicity of ceramic capacitors, 20, there between. The crimp comprises at least one electrical crimp, 42, which forms an electrical contact with a conductor of a wire, 44, and an optional but preferred insulated crimp, 43, which provides structural support and may crimp on the insulation of the wire. An optional structural perforated plate, 46, is provided to physically stabilize the stack of capacitors. The structural perforated plate is the same as a perforated plate described herein with the difference being the absence of, or non-use of, a mounting element.

FIG. 6 is perspective schematic view of an electronic component, 1, shown mounted to a substrate, 2. FIG. 7 is a schematic end view of one end of the component of FIG. 6. FIG. 8 is a schematic cross-sectional side view of the electronic component of FIG. 6. FIG. 9 is a perspective end view of an electronic component and FIG. 10 is a schematic cross-sectional side view of the electronic component of FIG. 9. The details of the capacitor composition is provided elsewhere herein.

In FIGS. 6-10, ceramic capacitors, 101, with external terminations, 6 and 6a, are sandwiched between leads comprising perforated plates, 4 and 4a, with integral feet, 8 and 8a, as mounting elements. The perforated plate comprises perforations, 10, and edge indentations, 11. Bonding material, 9, is between the perforated plate and the edge, 3 and 3a, of the external termination, 6 and 6a. The capacitors are separated by a distance, S. The width of the capacitor is designated $W_C$ and the width of the lead is designated $W_L$. The distance from the side of the lead to the center of the lead is designated $W_M$ and the distance between the center of the perforation to the center of the lead is designated $P_O$. The thickness of the capacitor is designated $T_C$. The diameter of the perforation is designated $D_O$ wherein the diameter is the equivalent diameter of a round perforation with the same surface area as the perforation being measured. The thickness of the lead is designated $T_L$ and the separation of the lead from the external termination, or thickness of the bonding material there between, is designated h.

FIGS. 7 and 9 illustrate a lead frame element, 4, provided with perforations, 10, in the lead frame which overlap with the distance, designated S, between the capacitors. The perforations are illustrated as essentially round for convenience but the shape of the perforation is not particularly limited and can be an oval shape or a rectangle with radiused corners, for instance. For electronic components with a lead frame width, $W_L$, of no more than 3.175 mm (0.125 inches) one perforation is preferred, but more than one perforation can be employed with minimal additional advantage. For electronic components with a lead frame width of greater than 3.175 mm (0.125 inches) but no more than 6.35 mm (0.25 inches) the preferred number of perforations is 2. For electronic components with a lead frame width of more than 6.35 mm (0.25 inches) the number of perforations is preferably defined by the equation $2<n\le W_L/0.07$ where $W_L$ is measured in inches. For an asymmetrical perforation the longest principal dimension of the perforation is preferentially aligned parallel with the longest principal dimension of the capacitor external terminal. The length of the longest principal dimension of the perforation preferably ranges from $W_L/5<D_O<W_L/2.5$, and is preferably about $W_L/3$. In addition to the perforations being placed essentially coincident with, or overlapping the distance between capacitors, the perforations can be placed at the perimeter of the lead frame such that the longest principle dimension is essentially coincident with the edges of the capacitors, such as perforation 11 of FIG. 7. For FIGS. 6-10 the ratio $W_C/T_C$ is $\ge 1$.

If the corresponding strain for a bonding material at its yield point when measured at the expected maximum operating temperature of the component is known along with the coefficients of thermal expansion of the materials to be joined, the temperature extremes of the operating environment and the allowable maximum strain, the preferred ratio of the longest continuous lead frame length existing between adjacent perforations in the lead frame, a, taken from the neutral expansion point of that lead length, 13, of FIG. 7, to the bonding material thickness, h of FIG. 8, can be chosen to ensure adequate bonding joint reliability based on the equation:

$$\frac{a}{h} = \frac{\Delta\gamma_{YLD_{MAXT}}\beta}{\Delta\alpha\Delta T}$$

wherein:
a is the longest continuous length of lead material existing between adjacent openings
in the lead frame taken from the neutral expansion point of that length;
h is the thickness of the bonding material;
$\Delta\gamma_{YLD_{MAKT}}$
is the corresponding strain for a bonding material at its yield point when measured at the expected maximum operating temperature of the component;
β is critical design factor which can vary from 0 to 1 and more preferably from 0.0001 to 1;
Δα Is the difference in coefficient of thermal expansion between the ceramic capacitor and the lead frame; and
ΔT is the operating temperature range.

The relation provides a lead frame and bonding joint design parameter, a/h, than can be used to design electronic component interconnects that are robust at high temperatures provided the mechanical properties of the lead frame, electronic component and bonding material as well as the desired life expectancy of the interconnect are known. As can be seen, as the denominator of the equation increases due to an increase in the difference in the coefficient of thermal expansion of the materials, an increase in the operating temperature, or both, the ratio a/h must decrease in order to maintain the maximum allowable strain below the desired limit defined by β.

The value for β is preferably as small as practical to maximize expected lifetime of the bonding material at the operating conditions, a preferred range for β is $0.002<\beta<0.1$, and more preferably $0.01<\beta<0.05$. The ratio a/h is chosen to be practical for manufacturing, with the preferred ratio $2<a/h<100$, and more preferably $5<a/h<30$. The dimension for a is preferably from the range $0.05W_L<a<0.5W_L$, with h ranging from $0.01<a<h<0.5a$ with the preferred range $0.033a<h<0.2a$. The dimensions of a are realized by choosing the number and size of perforations in the lead frame. For ease of manufacturing, the size of all perforations in the lead frame are preferably the same, however the size of perforations in the lead frame can vary in order to achieve the desired a/h ratio and to provide a component that is easy to manufacture.

Following the design guidelines described in this embodiment to determine the placement of perforations in lead frames and the thickness of the bonding joint where metal lead frames are bonded to ceramic capacitors results in improved expected lifetime of the bonding material when the component is exposed to high temperatures and high strain temperature cycling.

An embodiment of the invention is illustrated in perspective schematic view in FIG. 11 as mounted to a substrate. The embodiment of FIG. 11 without the substrate is illustrated in schematic end view in FIG. 12 and in schematic cross-sectional view in FIG. 13. The electronic component, generally represented as 1, comprises two ceramic capacitors and most preferably two multi-layered ceramic capacitor.

The electronic component, 1, as shown in FIGS. 11, 12 and 13 is illustrated with two ceramic capacitor elements for convenience of illustration with the understanding that the number of capacitor elements in the electronic component is not limited by the illustration and may be as few as one or as many as 50. Each electronic component, 1, has ceramic capacitors, 101, with main surfaces, 7, oriented essentially horizontally to the circuit board, or substrate, 2, but the capacitor elements could also be oriented so that the main surface, 7, is essentially perpendicular to the mounting substrate. The parameters, $W_C$, $W_L$ and $T_C$ are as defined relative to FIG. 9. $P_H$ is the height of the protrusion, which will be defined elsewhere herein, from the top of the capacitor and $P_W$ is the lateral distance, parallel to the substrate, of the protrusion from the center of the capacitor or from ½ $W_C$ from the side of the capacitor. For FIGS. 11, 12 and 13 the ratio $W_C/T_C$ is at least 1.

As shown in FIG. 11 the electronic component, 1, is mounted on substrate, 2. The substrate is not limited to a particular type of substrate, and may be, for example, glass epoxy type, flexible type or metal clad. A particularly preferred substrate is a metal clad substrate used to dissipate heat in high power circuits with a high coefficient of thermal expansion such as from 13 to 30 ppm/° C.

As shown in FIGS. 8 and 13, the electronic component, 1, includes one or more capacitor bodies, 101, comprising internal electrodes, 102, of alternating opposite polarity separated by a dielectric material, 103. Alternate layers are in electrical contact with opposite capacitor terminals, 6 or 6a. The dielectric material is not particularly limited and may consist mainly of $BaTiO_3$, $CaTiO_3$, $SrTiO_3$, $CaZrO_3$, or other suitable material.

As shown in FIGS. 11 12 and 13, a first external lead frame, 4, is disposed on the first capacitor terminal end surface, 3, and a second external lead frame, 4a, is disposed on the second end surface 3a.

An end surface, 3 or 3a, of the capacitor terminal, 6 or 6a, is bonded to the external lead frame, 4 or 4a. A mounting element, 8 or 8a, illustrated as a foot is bonded to the substrate, 2, with each external lead frame in electrical contact with a circuit trace on the substrate as would be readily understood. The mounting element is illustrated as a foot for surface mounting with the understanding that other embodiments could be used such as a pin for through hole mounting or a crimp for attachment of a wire for soft-lead mounting.

The external lead frame, 4, comprises one or more protrusions, 5, extending from the lead frame face, 41, towards the end surface, 3, of the capacitor. A protrusion is any physical body extending from the lead frame face which may be formed as a stamped portion of the lead frame or as a stud attached to the lead frame. The protrusion can extend across the width of the lead frame, such as in a rib which will be described with reference to FIG. 14, or it may have a dimension which is less than the width of the lead frame such as a stud which will be described with reference to FIGS. 11-13. A stamped round stud is preferable due to manufacturing conveniences. The protrusion height, illustrated as $S_H$ of FIG. 13, establishes a minimum separation distance between the lead frame face, 41, and the end surface, 3, and preferably the protrusion abuts the end surface such that the protrusion height defines the thickness, h, of the bonding material, 9, used to secure the lead frame to the external terminal of the capacitor element. For electronic components with lead frame width, $W_L$ of no more than 3.175 mm (0.125 inches), one protrusion can be used per capacitor with two protrusions per capacitor being preferred. For electronic components with lead frame width of over 3.175 mm (0.125 inches) the preferred number of protrusions is 2 or more since this insures the end surface is parallel to the frame face with more than 2 being suitable for demonstration of the invention. The shape of the protrusion is not particularly limited and may be a rib shape or preferably a round shape. Round protrusions with a nominal diameter D ranging from $T_L<D<5T_L$ are preferred. If the protrusion is not round the preferred size is one that provides a surface area which has an equivalent diameter the same as a round protrusion with the nominal diameter range as stated above. The preferred location of the protrusion in the X axis, defined as parallel to the substrate and the lead frame face, when there are two protrusions is $0.15W_C<P_W<0.45W_C$. The preferred location in the Z axis, defined as perpendicular to the substrate and parallel to the lead frame face, is preferably $0.4T_C$ to $0.6T_C$ with the most preferred location being $0.5T_C$.

An embodiment of the invention is illustrated in schematic side view in FIG. 14 wherein the protrusions are in the form of ribs, 51. The ribs may extend the width of the lead frame and this is desirable for manufacturing convenience. The ribs are oriented such that adjacent ribs provide an adhesive channel, 52, at each capacitor end surface, 3, with adhesive, 9, therein. Adjacent ribs also provide a vacant channel, 53, without adhesive therein.

The materials of the external lead frame is not limited. External lead frames comprising metals, such as Cu, Ni, Ag, Pd, Fe, Al and Au, and alloys including one or more of these metals, such as an Ag—Pd alloy are exemplary for demonstration of the invention. In order to prevent oxidation or the like the external lead frame can comprise one or more plated metal layers, such as a Ni-plated film or a Sn-plated film. The type and material of the plated metal is not limited and may include materials commonly used for electronic components such as Cu, Ag, Au, Pd, Pb or alloys of these metals. A particularly preferred external lead for demonstration of the invention is a non-ferrous low inductance lead material having a coefficient of thermal expansion of between 13 and 30 ppm/° C. Non-Ferrous means less than about 0.10 wt % iron.

A method for bonding the mounting element of the external lead frame to the substrate is not particularly limited herein. For example, the mounting element of the external lead frame may be bonded to the substrate using an appropriate bonding material, such as high-temperature solder, a conductive adhesive including conductive fine particles, a bolt, a rivet, or the like. High temperature solders include, without limit thereto, Sn/Sb high-temperature solders, Sb/Pb eutectic solders, Sn/Ag/Cu lead-free solders, Sn/Cu Pb-free solder and the like. Transient liquid phase sintering adhesives and polymer solders may also be suitable. Additionally, the electronic component may have a lead wire crimped or soldered to the lead frame plate for a soft attachment elsewhere in the circuit and therefore the electronic component can be mechanically mounted at any suitable location preferably on the substrate.

A method for bonding the end surface of the capacitor terminal to the external lead frame is not particularly limited herein. For example, the end surface of the capacitor terminal can be bonded to the lead frame using an appropriate bonding material, such as a high-temperature solder, a conductive adhesive including conductive fine particles, or the like. High temperature solders include, without limit thereto, Sn/Sb high-temperature solders, Sb/Pb eutectic solders, Sn/Ag/Cu lead-free solders, Sn/Cu Pb-free solder and the like. Transient liquid phase sintering adhesives and polymer solders may also be suitable.

Throughout the specification comparative measurements are measured in common units and non-comparative measurements are measured in inches unless otherwise specified.

EXAMPLES

The benefits of the invention are demonstrated in the following examples. Each of Example 1-4 used MLCC's in a stack of 4. The MLCC's had a case size of 4060 which has length, from termination to termination of 10.2 mm (0.40 inches) and a width, perpendicular to the length, of 15.2 mm (0.60 inches). The MLCC's were made by conventional methods with high temperature COG dielectric with nickel electrodes and bonded to a phosphor bronze lead frame plated with nickel and silver using a high melting point Pb-based solder. For each example the capacitors were separated by a separation distance of about 0.25 mm (0.01 inches). Different lead frame designs were used in each case and each sample was made in triplicate using 10Sn/88Pb/2Ag solder to connect the MLCC and lead frames in each case.

Example 1

A comparative example was prepared with a flat lead with a width of 1.8 mm (0.071 inches) without perforation or protrusion connected along the length of each MLCC of a stack of four MLCC's using 10 mg of solder paste for each lead MLCC interface.

Example 2

A lead with edge indentations was manufactured and connected along the length of each MLCC using 10 mg of solder paste for each lead MLCC interface. The lead width was 1.8 mm (0.071 inches) with 5 edge indentations per edge that were half circles with a radius of 0.71 mm (0.028 inches) separated by about 2.2 mm (0.085 inches) with the group of 5 perforations approximately centered on the MLCC terminal. The edge indentations, 32, are illustrated schematically in FIG. 2.

Example 3

A crimped lead with protrusions was manufactured and connected along the length of each MLCC using 26 mg of solder paste for each lead MLCC interface. The lead width was 1.80 mm (0.071 inches) with 4 crimps per lead each having a width of about 0.38 mm (0.015 inches) where the lead contacted the capacitor terminal and arranged in two pairs of crimps oriented perpendicular to the length of the lead. The crimps within each pair were separated from each other by 1.8 mm (0.071 inches) and the center of each pair of crimps were separated from each other by about 10.2 mm (0.40 inches). The crimps extended from edge to edge of the lead. The height of each crimp was about 0.15 mm (0.006 inches). The pairs of crimps were located in the approximate center of the MLCC electrode terminals. The device is illustrated in FIG. 16.

Example 4

A lead with edge indentations and perforations was manufactured and connected along the length of each MLCC using 10 mg of solder paste for each lead MLCC interface. The lead width was 1.8 mm (0.071 inches) with 6 perforations per lead each having a diameter of 1.0 mm (0.040 inches) separated from each other by 2.2 mm (0.085 inches) with the group of 6 perforations approximately centered on the MLCC terminal. There were 5 edge indentations per edge that were half circles with a radius of 0.71 mm (0.028 inches) separated by about 2.2 mm (0.085 inches) located approximately midway between the perforations. The stack is as illustrated schematically in FIG. 2.

Temperature cycling is an important test used to assess the reliability of joints bonding electronic components to leads and lead frames. The objective of the temperature cycling test is to assess the robustness of the joint to withstand stresses caused by exposures to extremes of high and low temperatures and to the effect of alternate exposures to these temperature extremes.

The three identical stacks of each sample from Examples 1-4 were subjected to hundreds of temperature cycles from −40° C. to +240° C. with a temperature ramp rate greater than 25° C./min between the temperature extremes and a temperature soak of 15 minutes at each temperature extreme. Each of the stacks were periodically visually inspected at 12 positions at 50× magnification and probed for any crack separation. The 12 positions are illustrated schematically in FIG. 17 as P1-P12. The extent of any crack separation was measured in each case. The average crack length detected for each example is shown for up to 1140 temperature cycles in FIG. 18.

As described by G. Halford in *Fatigue and Durability of Structural Materials*, ASM International, 2006, pp 260, solder fatigue crack behavior like that shown in FIG. 18 is observed to occur in two distinct stages, crack initiation and crack propagation. Crack initiation is said to occur when the many small cracks formed during the crack initiation stage consolidate into one larger crack that can rapidly propagate under the applied stresses. The results for examples 1-4 shown in FIG. 18 are replotted in FIG. 19, assuming a linear crack propagation stage occurring after a crack initiation stage. The linear behavior of the crack propagation stage can be extrapolated to zero crack length to estimate the approximate number of cycles to initiation of the solder fatigue crack. The results of temperature cycle testing on example capacitor stacks 1-4 is shown in Table 1. It can be seen that the average solder fatigue crack length after a representative 400 temperature cycles decreases as the a/h ratio decreases, with example 4 having excellent performance, exhibiting no cracking of the solder joint up to 600 temperature cycles.

TABLE 1

| Example | a/h | Cycles to crack initiation | Average crack length @ 400 cycles, mm (inches) |
|---|---|---|---|
| 1 | 317 | 140 | 1.4 (0.056) |
| 2 | 190 | 260 | 0.94 (0.037) |
| 3 | 44 | 420 | 0 |
| 4 | 11 | 670 | 0 |

Examples 5-10

Example 5-10 were constructed of a lead frame bonded to each terminal of an MLCC using a high melting point Pb-based solder with the composition 10Sn/88Pb/2Ag. The MLCC's were made by conventional methods with high temperature COG dielectric with nickel electrodes. The lead frames, with no perforations, varied in width from 3.3 mm (0.13 inches) to 8.4 mm (0.33 inches) and were composed of phosphor bronze base metal with nickel and silver overplate. The MLCC's had a case size of 4540 which has length, from termination to termination of 10.2 mm (0.45 inches) and a width, perpendicular to the length, of 15.2 mm (0.40 inches). The solder thickness was varied from 0.022 mm (0.00088 inches) to 0.24 mm (0.0094 inches) so as to create lead and joint designs that yield a/h ratios ranging from 7 to 176. Samples of examples 5-10 were subjected to temperature cycling from −40° C. to +240° C. with a temperature ramp rate greater than 25° C./min between the temperature extremes and a temperature soak of 15 minutes at each temperature extreme. Shear strength testing of samples before and after 300 temperature cycles was performed at 200° C. to determine the amount of solder joint strength remaining after temperature cycling. A minimum of four samples of each combination of lead width and solder joint thickness were shear tested.

TABLE 2

| Example | Lead Width, inches | Solder Thickness, inches | a/h | Initial Shear Strength, psi | Shear Strength after 300 Cycles, psi | Percent Reduction in Strength |
|---|---|---|---|---|---|---|
| 5 | 0.33 | 0.00094 | 176 | 1120 | 400 | 65% |
| 6 | 0.23 | 0.0011 | 105 | 1030 | 580 | 44% |
| 7 | 0.13 | 0.00088 | 74 | 1010 | 630 | 38% |
| 8 | 0.23 | 0.0058 | 20 | 1160 | 860 | 26% |
| 9 | 0.13 | 0.0049 | 13 | 1040 | 920 | 12% |
| 10 | 0.13 | 0.0094 | 7 | 1150 | 920 | 20% |

As can be seen in Table 2, an a/h ratio less than about 20 results in a solder bonding joint with shear strength after 300 temperature cycles measured at 200° C. that is more than twice the shear strength observed for a conventional joint design with a/h about 176.

Examples 11-12

The strap lead designs of Examples 11 and 12 comprising 4 MLCC's were prepared to determine if the results obtained for examples 1-10 comprising one MLCC per lead would be confirmed in a conventional stack with 4 MLCC's. The MLCC's had a case size of 4060, as described, bonded to a phosphor bronze lead frame plated with nickel and silver using a high melting point Pb-based solder. The capacitors were separated by a separation distance of about 0.25 mm (0.01 inches) so the capacitors can move in the Y direction, defined herein as lead frame and capacitor parallel to the substrate, as the lead expands and contracts with temperature. Two lead frames, each with width of 5.8 mm (0.23 inches) were bonded to the terminals of the MLCC's as shown in FIG. 15. The solder joint thickness for example 11 was 0.015 mm (0.0006 inches), resulting in an a/h ratio about 108 and the solder joint thickness of example 12 was 0.14 mm (0.0057 inches) resulting in an a/h ratio about 20. Samples of examples 11 and 12 were subjected to temperature cycling from −40° C. to +240° C. with a temperature ramp rate greater than 25° C./min between the temperature extremes and a temperature soak of 15 minutes at each temperature extreme. Peel strength testing of samples after 900 temperature cycles was performed at room temperature to determine the amount of solder joint strength remaining after temperature cycling. A minimum of four leads of each example were subjected to peel testing. Results of peel testing before and after temperature cycling indicate that the solder joint peel strength remaining after 900 temperature cycles for example 12 having a/h ratio about 20 was more than twice the peel strength of the conventional joint design having a/h ratio about 108, which is consistent with the results for examples 1-10.

TABLE 3

| Example | Lead frame width, inches | Solder joint thickness, inches | a/h | Average peel strength after 900 cycles, lb/inch |
|---|---|---|---|---|
| 11 | 0.23 | 0.0006 | 108 | 17 |
| 12 | 0.23 | 0.0057 | 20 | 45 |

Example 13

A stack of two capacitors was manufactured at various bond joint thicknesses to demonstrate the advantages of the protrusions. The bond joint thickness was varied by using protrusions of varying height. The recorded bond joint thickness was measured in the area of the protrusion. Subsequently each of the manufactured ceramic components was bonded to an FR4 substrate and subjected to 500 temperature cycles from −55° C. to +125° C. with a temperature ramp rate greater than 45°/min between the temperature extremes and a temperature soak of 15 minutes at each temperature extreme. The ceramic capacitors used measured 5.56 mm×5.08 mm×1.91 mm (0.22 inches×0.2 inches×0.075 inches) and composed primarily of $BaTiO_3$ ceramic, and were of a design typically rated for 500V applications. The external terminals were formed of a fritted Cu layer with a Ni-plated layer and a Sn/Pb plated layer formed on the surface of the Cu layer. The lead frame was formed from a Phosphor Bronze alloy with a Ni-plated layer and Sn/Pb plated layer over the surface. The lead frame thickness was 0.0192 mm (0.0043 inches) and the width was 5.08 mm (0.2 inches). The separation between the two capacitor terminals was essentially zero. The bonding material used to bond the metal lead frame to the ceramic terminals was a high temperature Pb-containing solder alloy, such as 92.5Pb/5Sn/2.5Ag. The circuit board used for temperature cycle testing was an FR4 glass epoxy with a thickness of approximately 1.57 mm (0.062 inches) with component mounting pads consistent with accepted design principles for this ceramic component dimensions. No bias voltage was applied to the components during temperature cycling. At the end of 500 temperature cycles the components were subjected to high humidity with bias voltage in a humidity chamber operating at 85% relative humidity and 85° C. A bias voltage of 200V was continuously applied and the components remained in the humidity chamber for 1000 hours. After the humidity treatment the components were subjected to 500V for a minimum of 5 seconds. Subsequently the room temperature insulation resistance was measured at 200V and the number of failures (F) was determined. A component was considered to have failed the test if the insulation resistance was less than 80% of the initial pre-test value after charging at 200V for 120 seconds. Failures were analyzed to determine if the low insulation resistance condition was the result of an internal crack.

Table 4 shows the experimental results for 30 capacitors of each set. As can be seen from the results setting the bonding joint thickness greater than 0.076 mm (0.003 inches) prevented electrical failures in the component due to cracks in the ceramic capacitors. This corresponds to an a/h ratio<33.

TABLE 4

| Example | $P_w$ | $P_H$ | D | $S_H$ | F | a/h | Analysis |
|---|---|---|---|---|---|---|---|
| 13 | 0.06 | 0.037 | 0 | 0.0004 | 17 | 250 | Cracks |
| 13A | 0.06 | 0.037 | 0.02 | 0.0014 | 7 | 71 | Cracks |
| 13B | 0.06 | 0.037 | 0.02 | 0.0022 | 2 | 45 | Cracks |
| 13C | 0.06 | 0.037 | 0.02 | 0.0030 | 1 | 33 | Crack |
| 13D | 0.06 | 0.037 | 0.02 | 0.0039 | 0 | 26 | |
| 13E | 0.06 | 0.037 | 0.02 | 0.0047 | 0 | 21 | |
| 13F | 0.06 | 0.037 | 0.02 | 0.0053 | 0 | 19 | |

Example 14

The ceramic component was manufactured as described in Example 13. The components were subjected to the same temperature cycling treatment as described in Example 13 except rather than an FR4 substrate, an aluminum substrate bonded to an FR4 circuit element was used. The aluminum substrate was approximately 1.57 mm (0.062 inches) thick and the FR4 substrate was approximately 0.76 mm (0.003 inches). The mounting pads were of the same design as those used in Example 13.

Table 5 shows the experimental results for 24 replications. As can be seen, setting the bonding joint thickness to 0.13 mm (0.0053 inches) prevented electrical failures in the component due to cracks in the ceramic capacitors.

TABLE 5

| Example | $P_W$ | $P_H$ | D | $S_H$ | F | a/h | Analysis |
|---|---|---|---|---|---|---|---|
| 14 | 0.06 | 0.037 | 0 | 0.0004 | 15 | 250 | Cracks |
| 14A | 0.06 | 0.037 | 0.02 | 0.0053 | 0 | 19 | |

The invention has been described with reference to the preferred embodiments without limit thereto. One of skill in the art would realize additional embodiments and improvements which are not specifically set forth herein but which are within the scope of the invention as more specifically set forth in the claims appended hereto.

The invention claimed is:

1. An electronic component comprising:
   capacitive elements wherein a first capacitive element of said capacitive elements comprises internal electrodes of alternating polarity separated by a dielectric; and
   said first capacitive element comprises external terminations with a first external termination of said external terminations in electrical contact with internal electrodes of a first polarity and a second external termination of said external terminations in electrical contact with internal electrodes of a second polarity; and
   a first external lead frame in electrical contact with said first external termination with a conductive bond there between wherein said first external lead frame comprises protrusions wherein a first set of said protrusions are adjacent protrusions which are parallel and each protrusion of said adjacent protrusions extends a length of said first external lead frame and form an adhesive channel on said first capacitive element wherein said adhesive channel is between said adjacent protrusions and adhesive is in said adhesive channel.

2. The electronic component of claim 1 comprising at least 2 to no more than 50 said capacitive elements.

3. The electronic component of claim 1 wherein said first external lead frame further comprises at least one feature selected from the group consisting of a perforation, and an edge indentation.

4. The electronic component of claim 3 wherein said first external lead frame comprises said protrusions and said edge indentation.

5. The electronic component of claim 3 wherein said first external lead frame has a width $W_L$ and a number of perforations selected from the group consisting of:
   $W_L$ of no more than 3.175 mm at least one perforation;
   $W_L$ of over 3.175 to no more than 6.35 mm at least 2 perforations; and
   $W_L$ of over 6.35 mm n perforations where n is defined by the equation $2<n \leq W_L/0.07$ wherein $W_L$ is defined in inches.

6. The electronic component of claim 3 wherein said first external lead frame has a width $W_L$ and wherein said perforation has a longest length, $D_O$, defined by the equation $W_L/5<D_O<W_L/2.5$.

7. The electronic component of claim 3 wherein at least one said perforation overlaps a separation between adjacent capacitive elements.

8. The electronic component of claim 1 further comprising a vacant channel between a second set of adjacent said protrusions.

9. The electronic component of claim 1 wherein said adjacent protrusions are stamped from said first external lead frame or attached to said first external lead frame.

10. The electronic component of claim 1 wherein at least one said protrusion of said adjacent protrusions abuts said first external termination.

11. The electronic component of claim 3 wherein said conductive bond has a thickness, h, which meets the criteria defined by:

$$\frac{a}{h} = \frac{\Delta \gamma_{YLD_{MAXT}} \beta}{\Delta \alpha \Delta T}$$

wherein:
a is a longest continuous length of said lead frame between adjacent perforations in said lead frame taken from a neutral expansion point of said longest continuous length;
$YLD_{MAXT}$ is a corresponding strain for a bonding material at its yield point when measured at an operating temperature range;
β is a critical design factor defined from 0 to 1;
Δα is a difference in coefficient of thermal expansion between said first capacitive element and said lead frame; and
ΔT is said operating temperature range.

12. The electronic component of claim 11 wherein said ß is defined as being from 0.002<ß<1.

13. The electronic component of claim 12 wherein said ß is defined as being from 0.01<ß<0.05.

14. The electronic component of claim 11 wherein said a/h is defined as being from 2<a/h<100.

15. The electronic component of claim 11 wherein said a/h is ß is defined as being from 5<a/h<30.

16. The electronic component of claim 11 wherein said a and h are related by the relationship 0.01a<h<0.5a.

17. The electronic component of claim 16 wherein said a and h are related by the relationship 0.033a<h<0.2a.

18. The electronic component of claim 1 wherein said first external lead frame comprises a mounting component selected from the group consisting of a foot, a pin and a crimp.

19. The electronic component of claim 1 wherein said first external lead frame comprises at least one metal selected from the group consisting of Cu, Ni, Ag, Pd, Fe, Al and Au, and alloys thereof.

20. The electronic component of claim 19 wherein said first external lead frame is non-ferrous.

21. The electronic component of claim 1 wherein said first external lead frame has a coefficient of thermal expansion of at least 13 to no more than 30 ppm/° C.

22. The electronic component of claim 1 wherein said first capacitive element has a principal dimension of greater than about 2.54 mm.

23. An electronic device comprising:
a component comprising:
a substrate;
capacitive elements mounted on said substrate wherein a first capacitive element of said capacitive elements comprises internal electrodes of alternating polarity separated by a dielectric; and
said first capacitive element comprises external terminations with a first external termination of said external terminations in electrical contact with internal electrodes of a first polarity and a second external termination of said external terminations in electrical contact with internal electrodes of a second polarity; and
a first external lead frame in electrical contact with said first external termination with a conductive bond there between wherein said first external lead frame comprises protrusions extending a length of said first external lead frame wherein a first pair of said protrusions are adjacent protrusions forming an adhesive channel on said first capacitive element with adhesive in said adhesive channel.

24. The electronic device of claim 23 wherein said component comprises at least 2 to no more than 50 said capacitive elements.

25. The electronic device of claim 23 wherein said first external lead frame further comprises at least one feature selected from the group consisting of a perforation and an edge indentation.

26. The electronic device of claim 25 wherein said first external lead frame comprises said perforation and said edge indentation.

27. The electronic device of claim 25 wherein said first external lead frame has a width $W_L$ and a number of perforations selected from the group consisting of:
$W_L$ of no more than 3.175 mm at least one perforation;
$W_L$ of over 3.175 to no more than 6.35 mm at least 2 perforations; and
$W_L$ of over 6.35 mm n perforations where n is defined by the equation $2 < n \leq W_L/0.07$ wherein $W_L$ is defined in inches.

28. The electronic device of claim 25 wherein at least one said perforation overlaps a separation between adjacent capacitive elements.

29. The electronic device of claim 25 wherein said first external lead frame has a width $W_L$ and wherein said perforation has a longest length, $D_O$ defined by the equation $W_L/5 < D_O < W_L/2.5$.

30. The electronic device of claim 23 further comprising a vacant channel between a second set of said protrusions.

31. The electronic device of claim 23 wherein said adjacent protrusions are stamped from said first external lead frame or attached to said first external lead frame.

32. The electronic device of claim 23 wherein a protrusion of said adjacent protrusions abuts said first external termination.

33. The electronic device of claim 25 wherein said conductive bond has a thickness, h, which meets the criteria defined by:

$$\frac{a}{h} = \frac{\Delta \gamma_{YLD_{MAXT}} \beta}{\Delta \alpha \Delta T}$$

wherein:
a is a longest continuous length of said lead frame between adjacent perforations in said lead frame taken from a neutral expansion point of said longest continuous length;
$YLD_{MAXT}$ is a corresponding strain for a bonding material at its yield point when measured at an operating temperature range;

β is a critical design factor defined from 0 to 1;
Δα is a difference in coefficient of thermal expansion between said first capacitive element and said lead frame; and
ΔT is said operating temperature range.

34. The electronic device of claim 33 wherein said ß is defined as being from $0.002<\beta<1$.

35. The electronic device of claim 34 wherein said ß is defined as being from $0.01<\beta<0.05$.

36. The electronic device of claim 33 wherein said a/h is defined as being from $$2<a/h<100.$$

37. The electronic device of claim 33 wherein said a/h is ß is defined as being from $5<a/h<30$.

38. The electronic device of claim 33 wherein said a and h are related by the relationship $0.01a<h<0.5a$.

39. The electronic device of claim 38 wherein said a and h are related by the relationship $0.033a<h<0.2a$.

40. The electronic device of claim 23 wherein said first external lead frame has a mounting component selected from the group consisting of a foot, a pin and a crimp.

41. The electronic device of claim 23 wherein said first external lead frame comprises at least one metal selected from the group consisting of Cu, Ni, Ag, Pd, Fe, Al and Au, and alloys thereof.

42. The electronic device of claim 41 wherein said first external lead frame is non-ferrous.

43. The electronic device of claim 23 wherein said first external lead frame has a coefficient of thermal expansion of at least 13 to no more than 30 ppm/° C.

44. The electronic device of claim 23 wherein said substrate is selected from the group consisting of glass epoxy substrate, flexible substrate and metal clad substrate.

45. The electronic device of claim 23 wherein said substrate has a coefficient of thermal expansion of from 13 to 30 ppm/° C.

46. The electronic device of claim 23 wherein said internal electrodes are either parallel or perpendicular to said substrate.

47. The electronic device of claim 23 wherein said first capacitive element has a principal dimension of greater than about 2.54 mm.

* * * * *